US009006634B2

(12) United States Patent
Sasaki

(10) Patent No.: US 9,006,634 B2
(45) Date of Patent: Apr. 14, 2015

(54) SOLID STATE IMAGING DEVICE HAVING A PHOTOELECTRIC CONVERSION LAYER WITH PLURAL SILICON GERMANIUM LAYERS, AND METHOD OF MANUFACTURING

(71) Applicant: Hiroki Sasaki, Kanagawa (JP)

(72) Inventor: Hiroki Sasaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 256 days.

(21) Appl. No.: 13/724,448

(22) Filed: Dec. 21, 2012

(65) Prior Publication Data
US 2014/0054444 A1    Feb. 27, 2014

(30) Foreign Application Priority Data

Aug. 21, 2012 (JP) ................. 2012-182357

(51) Int. Cl.
| H01L 27/00 | (2006.01) |
|---|---|
| H01L 31/0312 | (2006.01) |
| H01L 31/18 | (2006.01) |
| H01L 27/146 | (2006.01) |

(52) U.S. Cl.
CPC ........ *H01L 31/0312* (2013.01); *H01L 31/1812* (2013.01); *H01L 27/14609* (2013.01); *H01L 27/1461* (2013.01); *H01L 27/14621* (2013.01); *H01L 27/14627* (2013.01); *H01L 27/14634* (2013.01); *H01L 27/1464* (2013.01)

(58) Field of Classification Search
CPC ..................... H01L 27/14643; H01L 27/1461; H01L 27/1464; H01L 31/0312

USPC ........................ 250/208.1, 214 R, 239, 214.1; 257/225–233, 290, 291, 432–436, 440
See application file for complete search history.

(56) References Cited

U.S. PATENT DOCUMENTS

| 6,448,614 B2 | 9/2002 | Kubo et al. |
|---|---|---|
| 7,872,284 B2 * | 1/2011 | Mouli ........................... 257/225 |

FOREIGN PATENT DOCUMENTS

| JP | 2001-345436 | 12/2001 |
|---|---|---|
| JP | 2011-124946 | 6/2011 |
| JP | 2011-155248 | 8/2011 |
| WO | WO 2011/074156 A1 | 6/2011 |

OTHER PUBLICATIONS

T. A Langdo et al. "High Quality Ge on Si by expitaxial necking" Applied Physics Letters, vol. 76, No. 25, Jun. 19, 2000 pp. 3700-3702.

Steven J. Koester et al. "Germanium-on-SOI Infrared Detectors for Integrated Photonic Applications", IEEE Journal of Selected Topics in Quantum Electronics, vol. 12, No. 6, Nov./Dec. 2006, pp. 1489-1502.

* cited by examiner

*Primary Examiner* — Que T Le
(74) *Attorney, Agent, or Firm* — Oblon, McClelland, Maier & Neustadt, L.L.P.

(57) ABSTRACT

According to one embodiment, a solid state imaging device includes a first SiGe layer provided at an uppermost layer of a photoelectric conversion layer from the viewpoint of an incident light side, and a second SiGe layer provided under the first SiGe layer in the photoelectric conversion layer and having a higher Ge concentration than the first SiGe layer.

19 Claims, 8 Drawing Sheets

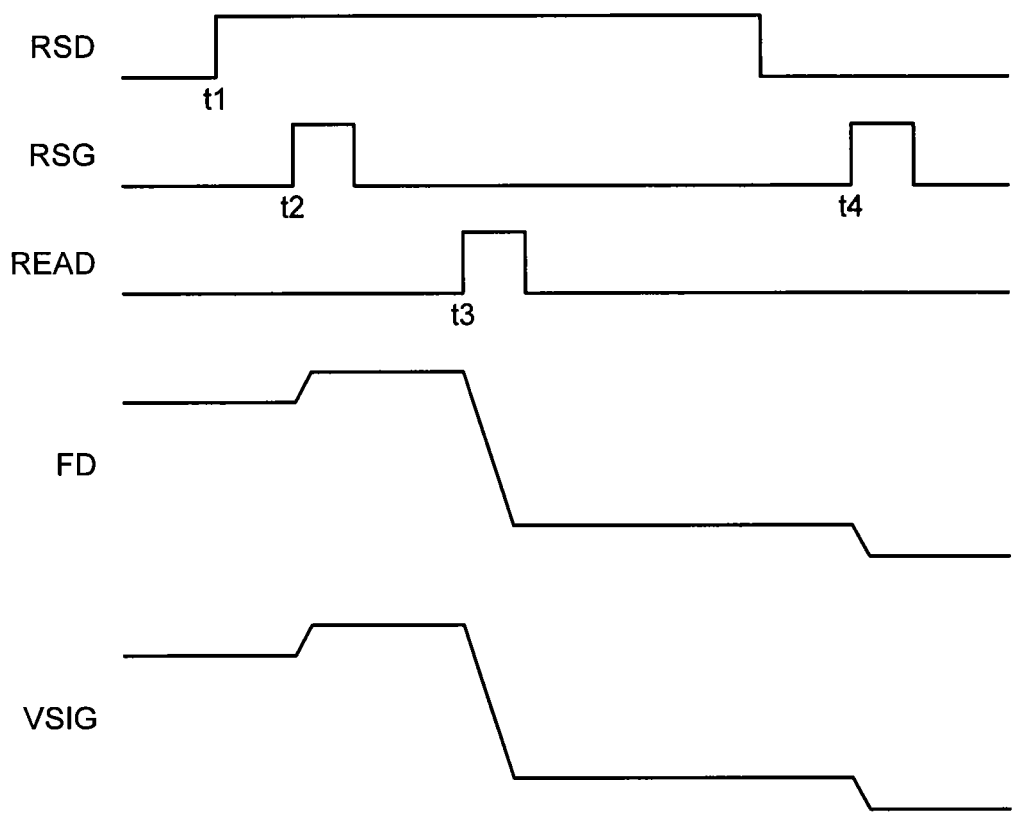

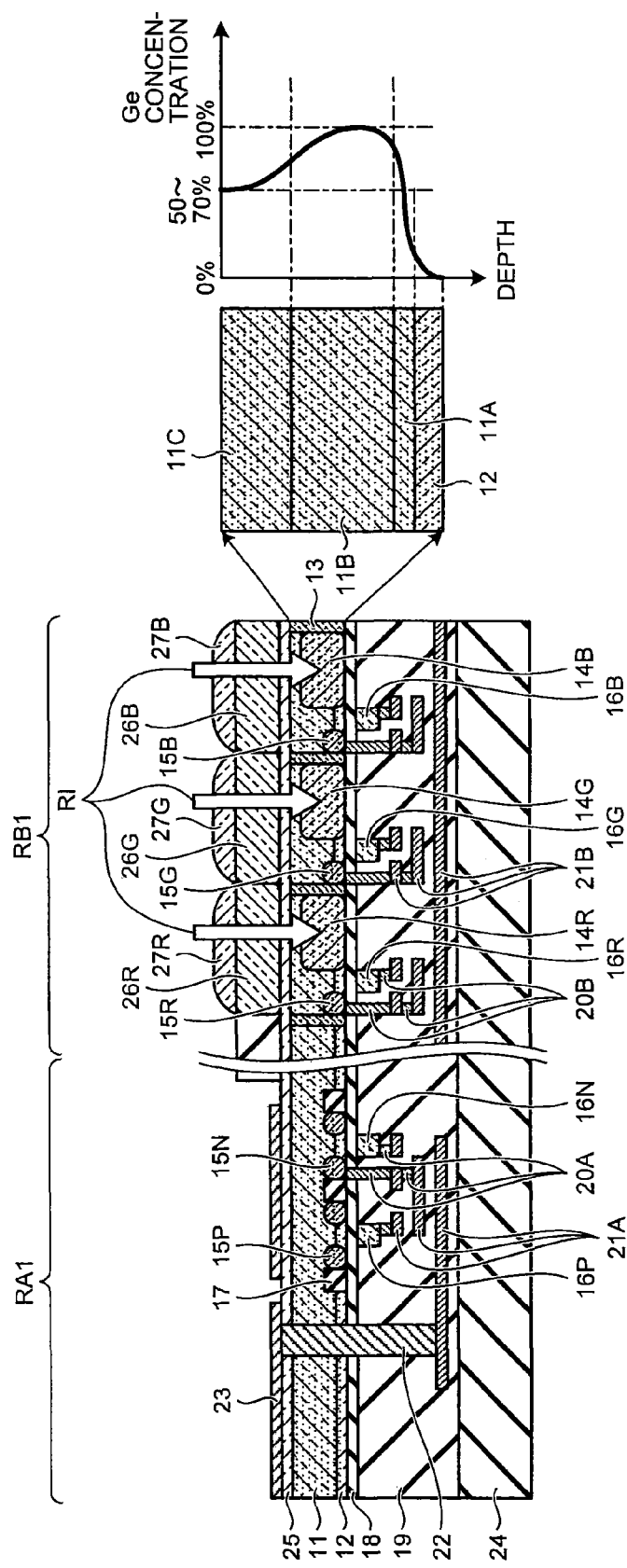

SOLID STATE IMAGING DEVICE HAVING A PHOTOELECTRIC CONVERSION LAYER WITH PLURAL SILICON GERMANIUM LAYERS, AND METHOD OF MANUFACTURING

CROSS-REFERENCE TO RELATED APPLICATIONS

This application is based upon and claims the benefit of priority from Japanese Patent Application No. 2012-182357, filed on Aug. 21, 2012; the entire contents of which are incorporated herein by reference.

FIELD

Embodiments of the present invention relate to a solid state imaging device and a method of manufacturing a solid state imaging device.

BACKGROUND

In a solid state imaging device, in order to reduce the depth of a photoelectric conversion layer according to the miniaturization of a pixel, there is proposed a method of using Ge that has a smaller bandgap than Si. However, for Ge, the sensitivity of red light is high, but the sensitivity of blue light is low.

BRIEF DESCRIPTION OF THE DRAWINGS

FIG. 3 is a timing chart illustrating a voltage waveform of each unit in a read operation of the pixel of FIG. 2A;

FIG. 4A is a cross-sectional view illustrating a schematic configuration of the solid state imaging device of FIG. 1, FIG. 4B is an enlarged cross-sectional view illustrating a portion of a SiGe layer 11 and a Si layer 12 of FIG. 4A, and FIG. 4C is a diagram illustrating a depth-direction concentration profile of the SiGe layer 11 and the Si layer 12 of FIG. 4B;

DETAILED DESCRIPTION

In general, according to one embodiment, a solid state imaging device includes a first SiGe layer and a second SiGe layer. The first SiGe layer is provided at an uppermost layer of a photoelectric conversion layer from the viewpoint of an incident light side. The second SiGe layer is provided under the first SiGe layer in the photoelectric conversion layer and having a higher Ge concentration than the first SiGe layer.

Hereinafter, a solid state imaging device and a method of manufacturing a solid state imaging device according to embodiments will be described in detail with reference to the accompanying drawings. In addition, the present invention is not limited by these embodiments.

First Embodiment

Figure 1:
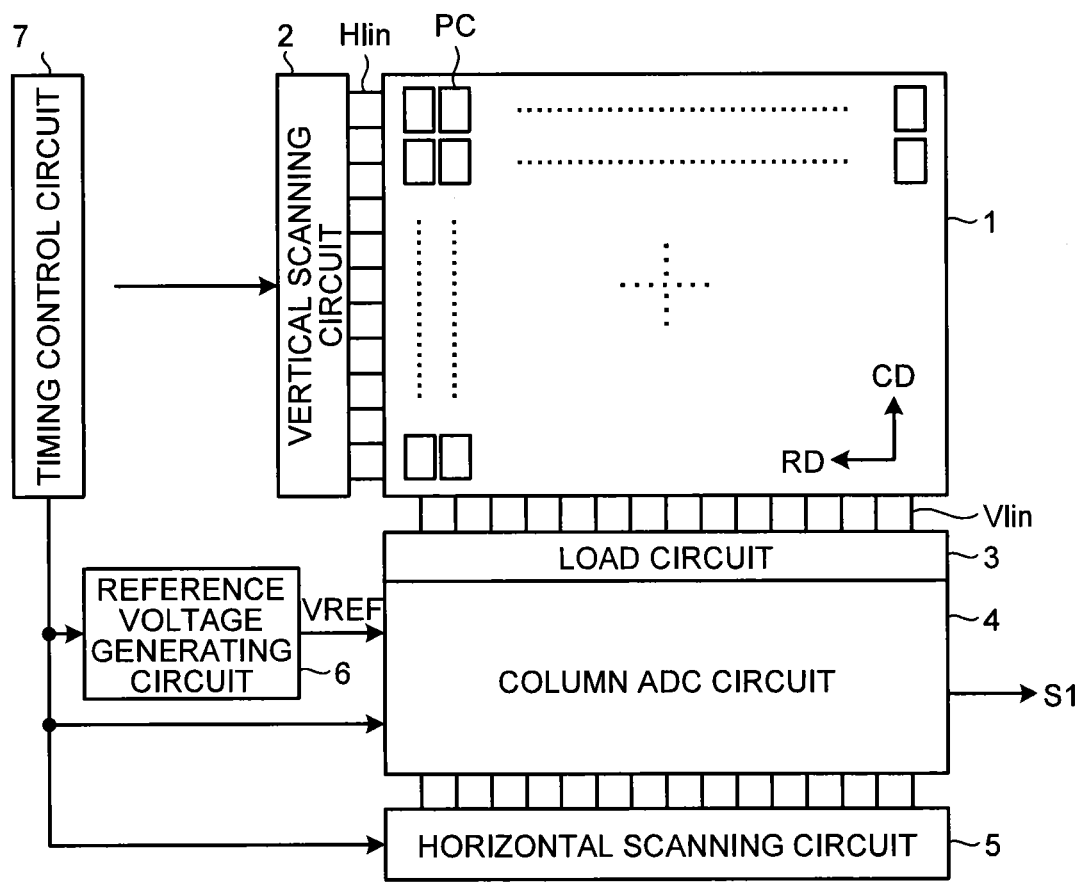
FIG. 1 is a block diagram illustrating a schematic configuration of a solid state imaging device according to a first embodiment.

FIG. 1 is a block diagram illustrating a schematic configuration of a solid state imaging device according to a first embodiment.

Referring to FIG. 1, a pixel array unit 1 is provided in a solid state imaging device. In the pixel array unit 1, pixels PC storing photoelectrically converted charges are arranged in a matrix configuration in a row direction RD and a column direction CD. Also, in the pixel array unit 1, horizontal control lines Hlin performing read control of the pixels PC are provided in the row direction RD, and vertical signal lines Vlin transmitting signals read from the pixels PC are provided in the column direction CD. Also, a photoelectric conversion layer is provided in the pixels PC. In the photoelectric conversion layer, from the viewpoint of a light incidence side, a first SiGe layer is provided at an uppermost layer of the photoelectric conversion layer, and a second SiGe layer is provided under the first SiGe layer. The second SiGe layer has a higher Ge concentration than the first SiGe layer.

Also, the solid state imaging device includes a vertical scanning circuit 2 provided to scan the pixels PC as a read target in a vertical direction, a load circuit 3 provided to read signals from the pixels PC with respect to each column in the vertical signal lines Vlin by performing a source follower operation between the pixels PC, a column ADC circuit 4 provided to detect a signal component of each pixel PC with respect to each column by a CDS, a horizontal scanning circuit 5 provided to scan the pixels PC as a read target in a horizontal direction, a reference voltage generating circuit 6 provided to output a reference voltage VREF to the column ADC circuit 4, and a timing control circuit 7 provided to control a read or storage timing of each pixel PC. In addition, the reference voltage VREF may use a ramp wave.

Then, the pixels PC are scanned by the vertical scanning circuit 2 in the vertical direction, so that the pixel PCs selected in the row direction RD. Then, in the load circuit 3, a source follower operation is performed between the pixels PC, so that signals read from the pixels PC are transmitted through the vertical signal lines Vlin to the column ADC circuit 4. Also, in the reference voltage generating circuit 6, a ramp wave is set as the reference voltage VREF and transmitted to the column ADC circuit 4. Then, in the column ADC circuit 4, a clock count operation is performed until a reset level and a signal level read from the pixel PC are identical to a level of a ramp wave, and a difference between the reset level and the signal level is taken, so that a signal component of each pixel PC is detected by the CDS and outputted as an output signal S1.

Herein, the first SiGe layer and the second SiGe layer are provided in the photoelectric conversion layer, so that the sensitivity of blue light in an upper layer of the photoelectric conversion layer can be improved and the sensitivity of red light in a lower layer of the photoelectric conversion layer can also be improved. Therefore, the depth of the photoelectric conversion layer can be reduced while suppressing the degradation of the sensitivity of blue light.

Figure 2A:
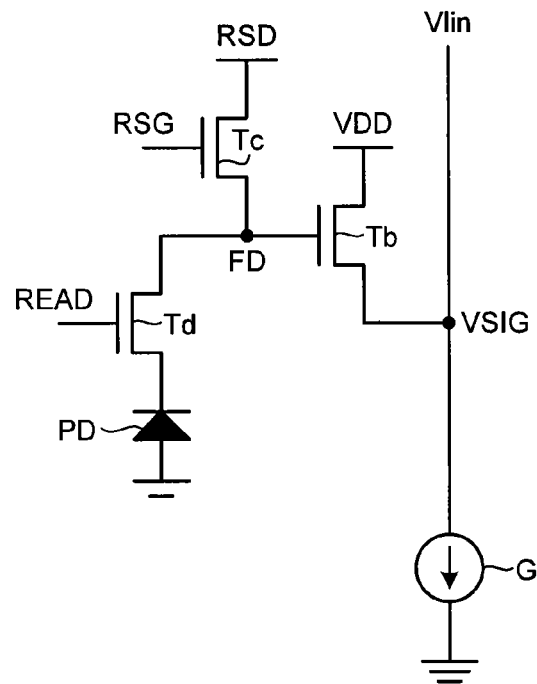
FIG. 2A is a circuit diagram illustrating an example of a configuration of a pixel in the solid state imaging device of FIG. 1.
Figure 2B:
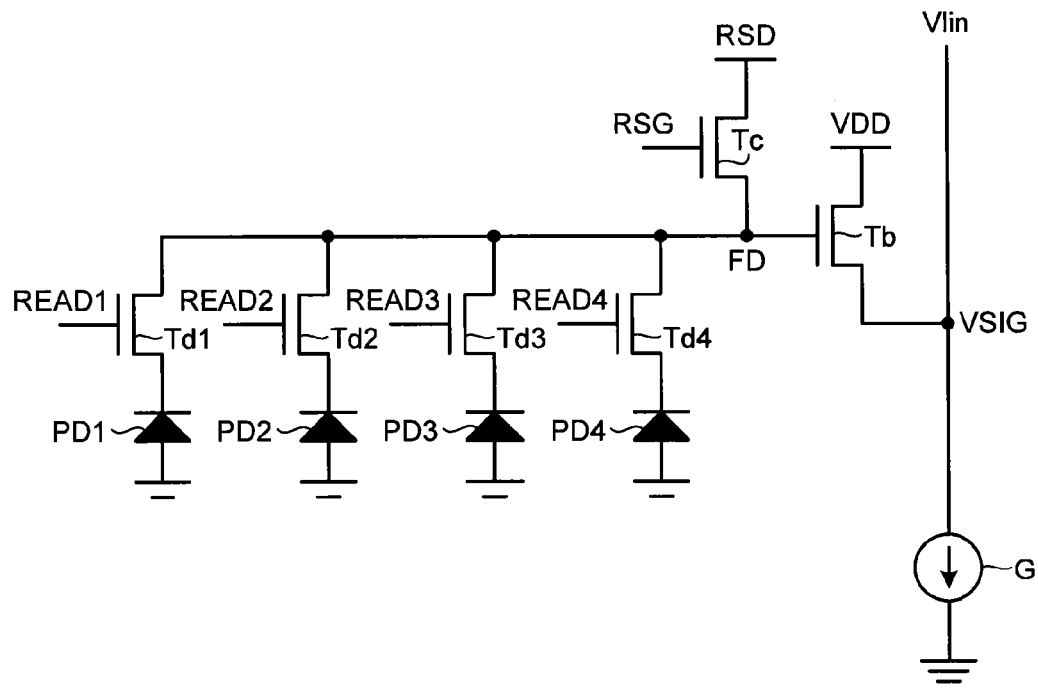
FIG. 2B is a circuit diagram illustrating another example of a configuration of a pixel in the solid state imaging device of FIG. 1.

FIG. 2A is a circuit diagram illustrating an example of a configuration of a pixel in the solid state imaging device of FIG. 1, and FIG. 2B is a circuit diagram illustrating another example of a configuration of a pixel in the solid state imaging device of FIG. 1.

Referring to FIG. 2A, a photodiode PD, an amplification transistor Tb, a reset transistor Tc, and a read transistor Td are provided in the pixel PC. Also, as a detection node, a floating diffusion FD is formed at a connection point between the amplification transistor Tb, the reset transistor Tc, and the read transistor Td.

Then, a source of the read transistor Td is connected to the photodiode PD, and a read signal READ is inputted to a gate of the read transistor Td. Also, a source of the reset transistor Tc is connected to a drain of the read transistor Td, a reset signal RSG is inputted to a gate of the reset transistor Tc, and a drain of the reset transistor Tc is connected to a power potential RSD. Also, a source of the amplification transistor Tb is connected to the vertical signal line Vlin, a gate of the amplification transistor Tb is connected to the drain of the read transistor Td, and a drain of the amplification transistor Tb is connected to a power potential VDD.

Also, in the load circuit 3, a current source G is provided for each column. Then, the current source G is connected to the vertical signal line Vlin in each column. In addition, the horizontal control line Hlin of FIG. 1 may transmit the read signal READ and the reset signal RSG to the pixel PC in each column.

FIG. 3 is a timing chart illustrating a voltage waveform of each unit in a read operation of the pixel of FIG. 2A.

Referring to FIG. 3, when the reset signal RSG rises (t2) while the power potential RSD rises (t1), the reset transistor Tc is turned on and an extra charge generated at a leak current or the like is reset at the floating diffusion FD. Then, a voltage depending on a reset level of the floating diffusion FD is applied to the gate of the amplification transistor Tb. Herein, since a source follower is constituted by the amplification transistor Tb and the current source G, a voltage of the vertical signal line Vlin follows the voltage applied to the gate of the amplification transistor Tb, and an output voltage VSIG of the reset level is outputted through the vertical signal line Vlin to the column ADC circuit 4.

Then, in the column ADC circuit 4, when a ramp wave is given as the reference voltage VREF while the output voltage VSIG of the reset level is inputted, the output voltage VSIG of the reset level is compared with the ramp wave.

Then, a downcount is performed until the output voltage VSIG of the reset level is identical to a level of the ramp wave, so that the output voltage VSIG of the reset level is converted into a digital value to be retained.

Next, when the read signal READ rises (t3), the read transistor Td is turned on, a charge stored in the photodiode PD is transmitted to the floating diffusion FD, a voltage depending on a signal level of the floating diffusion FD is applied to the gate of the amplification transistor Tb. Herein, since a source follower is constituted by the amplification transistor Tb and the current source G, a voltage of the vertical signal line Vlin follows the voltage applied to the gate of the amplification transistor Tb, and an output voltage VSIG of the signal level is outputted through the vertical signal line Vlin to the column ADC circuit 4.

Then, in the column ADC circuit 4, when a ramp wave is given as the reference voltage VREF while the output voltage VSIG of the signal level is inputted, the output voltage VSIG of the signal level is compared with the ramp wave.

Then, an upcount is performed until the output voltage VSIG of the signal level is identical to a level of the ramp wave, so that a difference between the output voltage VSIG of the signal level and the output voltage VSIG of the reset level is converted into a digital value to be outputted as an output signal S1.

Next, when the reset signal RSG rises (t4) while the power potential RSD falls, the reset transistor Tc is turned on and a potential of the floating diffusion FD is set to a low level. Therefore, the amplification transistor Tb is turned off, and a voltage of the vertical signal line Vlin does not follow the potential of the floating diffusion FD.

Also, referring to FIG. 2B, instead of the photodiode PD and the read transistor Td of FIG. 2A, photodiodes PD1 to PD4 and read transistors Td1 to Td4 are provided to constitute four pixels PC. In this configuration, the amplification transistor Tb and the reset transistor Tc are shared by the four pixels PC.

FIG. 4A is a cross-sectional view illustrating a schematic configuration of the solid state imaging device of FIG. 1, FIG. 4B is an enlarged cross-sectional view illustrating a portion of a SiGe layer 11 and a Si layer 12 of FIG. 4A, and FIG. 4C is a diagram illustrating a depth-direction concentration profile of the SiGe layer 11 and the Si layer 12 of FIG. 4B.

Referring to FIGS. 4A to 4C, in this solid state imaging device, a SiGe layer 11 is provided, and a Si layer 12 is formed under the SiGe layer 11 from the viewpoint of an incident light RI side. In addition, the SiGe layer 11 and the Si layer 12 may be set to be a P type. Also, a surface of the SiGe layer 11 may be a polished surface formed by removing the crystal defects of the SiGe layer 11. Herein, SiGe layers 11A to 11C are provided in the SiGe layer 11. The SiGe layer 11C is formed at an uppermost layer of the SiGe layer 11 from the viewpoint of the incident light RI side. In addition, a minimum value of the Ge concentration of the SiGe layer 11C may be set to be within a range of 50 to 70 at %. The SiGe layer 11B is formed under the SiGe layer 11C and has a higher Ge concentration than the SiGe layer 11C. In addition, a maximum value of the Ge concentration of the SiGe layer 11B may be set to 100 at %. The SiGe layer 11A is formed under the SiGe layer 11B and has a lower Ge concentration than the SiGe layer 11C. Also, a thickness of the SiGe layer 11 may be set to about 1 μm.

Herein, a pixel region RB1 and a peripheral region RA1 are provided in the SiGe layer 11 and the Si layer 12. In addition, the pixel array unit 1 of FIG. 1 may be formed in the pixel region RB1. The vertical scanning circuit 2, the load circuit 3, the column ADC circuit 4, the horizontal scanning circuit 5, the reference voltage generating circuit 6, and the timing control circuit 7 of FIG. 1 may be formed in the peripheral region RA1.

Then, in the pixel region RB1, at the SiGe layer 11 and the Si layer 12, a blue photoelectric conversion layer 14B, a green photoelectric conversion layer 14G, and a red photoelectric conversion layer 14R are formed in each pixel PC. In addition, the blue photoelectric conversion layer 14B, the green photoelectric conversion layer 14G, and the red photoelectric conversion layer 14R may constitute the photodiode PD of FIG. 2A. The blue photoelectric conversion layer 14B, the green photoelectric conversion layer 14G, and the red photoelectric conversion layer 14R may have, for example, a PNP structure, and a thickness of an N-type diffusion layer of the PNP structure may be substantially equal to a thickness of the SiGe layer 11. Also, at the SiGe layer 11 and the Si layer 12, a pixel separation layer 13 is formed to separate the blue photoelectric conversion layer 14B, the green photoelectric conversion layer 14G, and the red photoelectric conversion layer 14R in each pixel PC. In addition, the pixel separation layer 13 may be configured in a P-type impurity introduction layer.

Also, in the pixel region RB1, at the SiGe layer 11 and the Si layer 12, N-type impurity introduction layers 15B, 15G and 15R are formed to be adjacent respectively to the blue photoelectric conversion layer 14B, the green photoelectric conversion layer 14G, and the red photoelectric conversion layer 14R. Then, gate electrodes 16B, 16G and 16R are formed on the Si layer 12 through a gate insulating layer 18 such that the gate electrodes 16B, 16G and 16R are disposed between the blue photoelectric conversion layer 14B, the green photoelectric conversion layer 14G and the red photoelectric conversion layer 14R and the N-type impurity introduction layers 15B, 15G and 15R. In addition, a material of the gate insulating layer 18 may use, for example, a silicon oxide film. A material of the gate electrodes 16B, 16G and 16R may use, for example, a polycrystalline silicon film. Alternatively, a material of the gate electrodes 16B, 16G and 16R may use one or a combination of metal compounds such as a titanium nitride, a tantalum carbon, a lanthanum-based material, an aluminum-based material, and a magnesium-based material. The N-type impurity introduction layers 15B, 15G and 15R and the gate electrodes 16B, 16G and 16R may constitute the read transistor Td of FIG. 2A.

Also, in the pixel region RB1, on the Si layer 12, an interlayer insulating layer 19 is formed to cover the gate electrodes 16B, 16G and 16R. In addition, a material of the interlayer insulating layer 19 may use, for example, a silicon oxide film. Then, a plug electrode 20B and an interconnection 21B are buried in the interlayer insulating layer 19. In addition, the interconnection 21B may be connected through the plug electrode 20B to the N-type impurity introduction layers 15B, 15G and 15R and the gate electrodes 16B, 16G and 16R. In addition, a material of the plug electrode 20B and the interconnection 21B may use, for example, metals such as Al, Cu, and W.

Also, in the pixel region RB1, an antireflection film 25 is provided on the SiGe layer 11. In addition, a material of the antireflection film 25 may use, for example, a silicon nitride film, a hafnium oxide, or a tantalum oxide. On the antireflection film 25, a blue filter 26B, a green filter 26G, and a red filter 26R are provided corresponding respectively to the blue photoelectric conversion layer 14B, the green photoelectric conversion layer 14G, and the red photoelectric conversion layer 14R. On-chip lenses 27B, 27G and 27R are formed respectively on the blue filter 26B, the green filter 26G, and the red filter 26R.

On the other hand, in the peripheral region RA1, a device isolation insulating layer 17 is formed in the SiGe layer 11 and the Si layer 12. In addition, a shallow trench isolation (STI) may be used as the device isolation insulating layer 17. In addition, a material of the device isolation insulating layer 17 may use, for example, a silicon oxide film. Then, an N-type impurity introduction layer 15N and a P-type impurity introduction layer 15P are formed in an active region divided by the device isolation insulating layer 17. In addition, around the P-type impurity introduction layer 15P, an N well (not illustrated) may be formed in the SiGe layer 11 and the Si layer 12. Then, gate electrodes 16N and 16P are formed on the Si layer 12 through the gate insulating layer 18 such that the gate electrodes 16N and 16P are disposed respectively between the N-type impurity introduction layers 15N and the P-type impurity introduction layers 15P. In addition, a material of the gate electrodes 16N and 16P may use, for example, a polycrystalline silicon film. Alternatively, a material of the gate electrodes 16N and 16P may use one or a combination of metal compounds such as a titanium nitride, a tantalum carbon, a lanthanum-based material, an aluminum-based material, and a magnesium-based material.

Also, in the peripheral region RA1, on the Si layer 12, an interlayer insulating layer 19 is formed to cover the gate electrodes 16N and 16P. Then, a plug electrode 20A and an interconnection 21A are buried in the interlayer insulating layer 19. In addition, the interconnection 21A may be connected through the plug electrode 20A to the N-type impurity introduction layer 15N, the P-type impurity introduction layer 15P, and the gate electrodes 16P and 16N. In addition, a material of the plug electrode 20A and the interconnection 21A may use, for example, metals such as Al, Cu, and W.

Also, in the peripheral region RA1, an antireflection film 25 is provided on the SiGe layer 11. A pad electrode 23 is formed on the antireflection film 25. In addition, the pad electrode 23 may be connected through the plug electrode 20A to the interconnection 21A. Also, a support substrate 24 is provided on the interlayer insulating layer 19.

Then, incident light RI is concentrated by the on-chip lenses 27B, 27G and 27R in each pixel PC, and is incident through the blue filter 26B, the green filter 26G, and the red filter 26R onto the blue photoelectric conversion layer 14B, the green photoelectric conversion layer 14G, and the red photoelectric conversion layer 14R, respectively. Then, in the blue photoelectric conversion layer 14B, the green photoelectric conversion layer 14G, and the red photoelectric conversion layer 14R, charges are generated and stored according to the light quantity of the incident light RI. Then, through the read transistor Td of FIG. 2A, signals are read from the blue photoelectric conversion layer 14B, the green photoelectric conversion layer 14G, and the red photoelectric conversion layer 14R and are transmitted through the interconnections 21B and 21A to the peripheral region RA1, so that an output signal S1 is generated.

Herein, when the blue photoelectric conversion layer 14B, the green photoelectric conversion layer 14G, and the red photoelectric conversion layer 14R are formed by only the Si layer, a thickness of 3 μm or more is required in order to maintain the sensitivity of red light. On the other hand, by forming the blue photoelectric conversion layer 14B, the green photoelectric conversion layer 14G, and the red photoelectric conversion layer 14R by the SiGe layer 11, even when a thickness is set to about 1 μm, the sensitivity of red light can be maintained. Also, even when a pixel pitch is reduced to 1.4 μm or less, a color mixture between adjacent pixels can be suppressed. Also, by thinning the blue photoelectric conversion layer 14B, the green photoelectric conversion layer 14G, and the red photoelectric conversion layer 14R, ion implantation energy necessary to form the pixel separation layer 13 can be reduced, and the cumbersomeness of a manufacturing process can be prevented. Also, by providing the SiGe layer 11C at the uppermost layer of the SiGe layer 11, the Ge concentration in the uppermost layer of the SiGe layer 11 can be reduced, and the degradation of the sensitivity of blue light can be suppressed. Also, by setting the maximum value of the Ge concentration of the SiGe layer 11B to 100 at %, the sensitivity of red light can be improved, and the SiGe layer 11 can be thinned. Also, by setting the minimum value of the Ge concentration of the SiGe layer 11C to be within a range of 50 to 70 at %, the gradient of the Ge concentration of the SiGe layer 11 can be alleviated, and the degradation of the crystalline quality of the SiGe layer 11 can be suppressed. Also, by forming the Si layer 12 under the SiGe layer 11, the transistor can be formed even without using a low-temperature process.

Thus, the degradation of the quality of the transistor can be prevented while suppressing the cumbersomeness of the manufacturing process.

Second Embodiment

FIGS. 5A and 5B and FIGS. 6A and 6B are cross-sectional views illustrating a method of manufacturing a solid state imaging device according to a second embodiment.

Figure 5A:
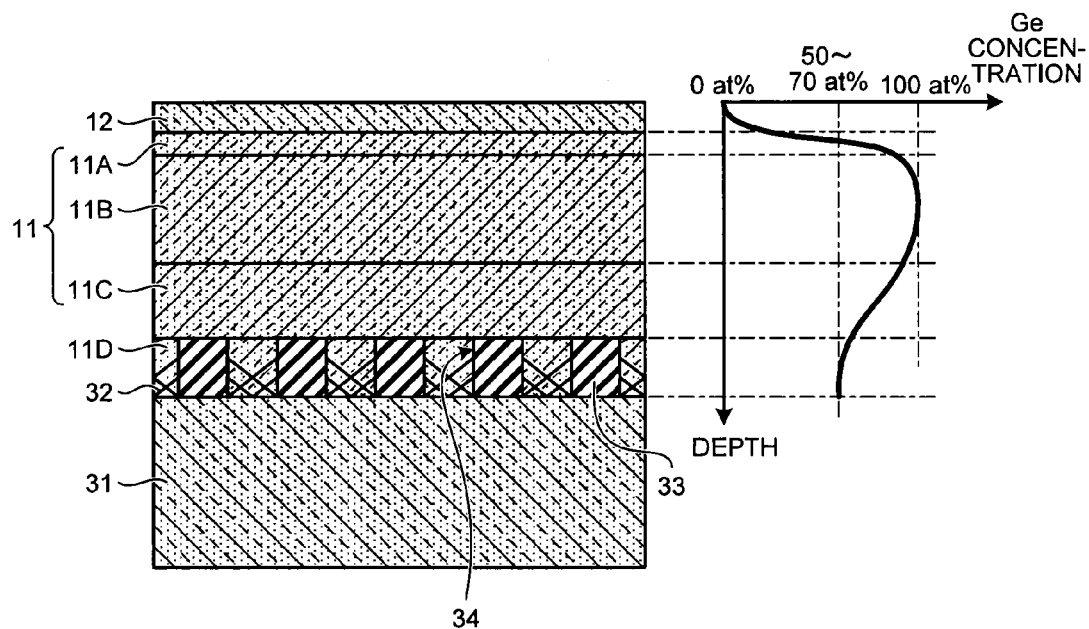
FIGS. 5A and 5B are cross-sectional views illustrating a method of manufacturing a solid state imaging device according to a second embodiment.

Referring to FIG. 5A, an insulating layer 33 is formed on a Si substrate 31 by thermal oxidation, CVD, or the like. In addition, a material of the insulating layer 33 may use, for example, a silicon oxide film. Also, a thickness of the insulating layer 33 may be set to be, for example, within a range of 100 to 150 nm. Then, an opening portion 34 exposing a portion of the surface of the Si substrate 31 is formed in the insulating layer 33 by using a photolithography technology and a dry etching technology. In addition, a diameter of the opening portion 34 may be set to be, for example, within a range of 100 to 200 nm.

Next, by performing SiGe epitaxial growth, a SiGe layer 11D buried in the opening portion 34 is formed on the Si substrate 31. In addition, preferably, a Ge concentration of the SiGe layer 11D may be set to be within a range of 50 to 70 at %. At this time, due to the lattice constant mismatch between the Si substrate 31 and the SiGe layer 11D, a crystal defect 32 is generated in the SiGe layer 11D in a 45° direction from the surface of the Si substrate 31. At this time, a depth of the crystal defect 32 may be set to about 30 nm, and since the crystal defect 32 can be confined in the opening portion 34, the crystal defect 32 can be suppressed from penetrating onto the SiGe layer 11D.

Next, when the opening portion 34 is fully filled with the SiGe layer 11D, the SiGe layer 11D is planarized by chemical mechanical etching (CMP) of the SiGe layer 11D. Then, by performing SiGe epitaxial growth using the planarized SiGe layer 11D as a seed crystal, SiGe layers 11C and 11B are sequentially formed on the insulating layer 33 and the SiGe layer 11D. At this time, preferably, a Ge concentration of the SiGe layer 11C may be adjusted to increase gradually from within a range of 50 to 70 at %, and a peak of the Ge concentration in the SiGe layer 11B may be set to be 100 at %. Also, preferably, the Ge concentration may be set to be 100 at % while a thickness of the SiGe layers 11C and 11B is set to be within a range of 30 to 200 nm. Then, in the SiGe layer 11B, Ge is epitaxially grown by about 100 to 500 nm, and then a SiGe layer 11A is formed such that the Ge concentration decreases toward 0 at %. In addition, by performing Si epitaxial growth, a Si layer 12 is formed on the SiGe layer 11A. In addition, a thickness of the Si layer 12 may be set to be, for example, within a range of 0 to 30 nm.

Figure 5B:
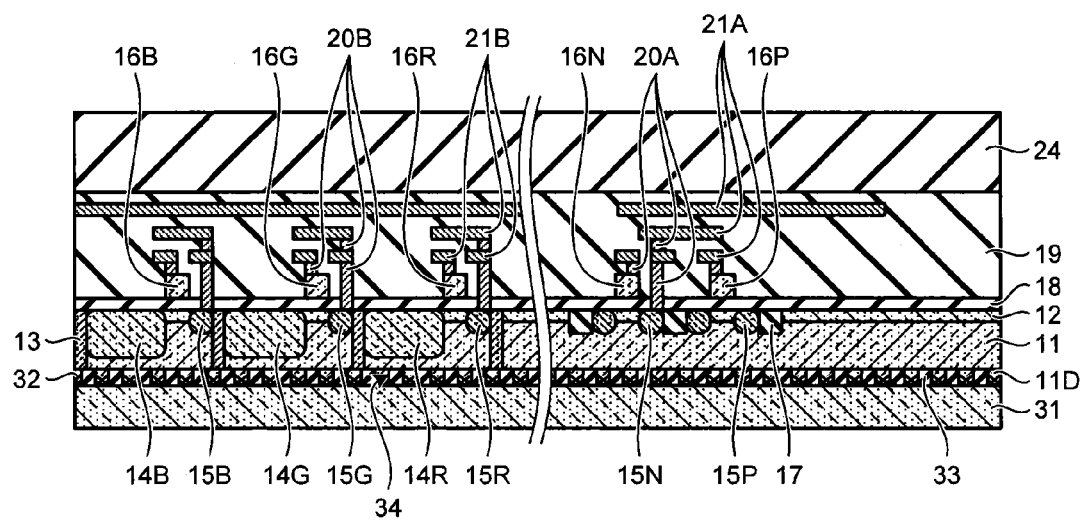

Next, as illustrated in FIG. 5B, by burying a device isolation insulating layer 17 in the SiGe layer 11 and the Si layer 12 and then ion-implanting P-type impurities, a pixel separation layer 13 is formed between pixels. Herein, by forming a blue photoelectric conversion layer 14B, a green photoelectric conversion layer 14G, and a red photoelectric conversion layer 14R in the SiGe layer 11, since the blue photoelectric conversion layer 14B, the green photoelectric conversion layer 14G, and the red photoelectric conversion layer 14R can be thinned, ion implantation energy necessary to form the pixel separation layer 13 can be reduced as compared to the case of forming the blue photoelectric conversion layer 14B, the green photoelectric conversion layer 14G, and the red photoelectric conversion layer 14R in the Si layer.

Then, after a gate insulating layer 18 is formed on the Si layer 12 by thermal oxidation or the like, gate electrodes 16N and 16P are formed in a peripheral region RA1 and gate electrodes 16B, 16G and 16R are formed at each pixel in a pixel region RB1.

Next, in the pixel region RB1, by ion-implanting impurity into the SiGe layer 11 and the Si layer 12, a blue photoelectric conversion layer 14B, a green photoelectric conversion layer 14G, and a red photoelectric conversion layer 14R are formed in each pixel. In addition, N-type impurity introduction layers 15B, 15G, 15R and 15N are formed by ion-implanting N-type impurity into the SiGe layer 11 and the Si layer 12, and a P-type impurity introduction layer 15P is formed by ion-implanting P-type impurity into the SiGe layer 11 and the Si layer 12.

Next, by CVD or the like, an interlayer insulating layer 19 is formed to cover the gate electrodes 16B, 16G, 16R, 16N and 16P. Then, plug electrodes 20A and 20B and interconnections 21A and 21B are formed to be buried in the interlayer insulating layer 19.

Next, a support substrate 24 is formed on the interlayer insulating layer 19. In addition, the support substrate 24 may be attached to the interlayer insulating layer 19. Also, for example, a material of the support substrate 24 may use a semiconductor substrate of Si or the like, or may use an insulating substrate of glass, ceramic, resin, or the like.

Figure 6A:
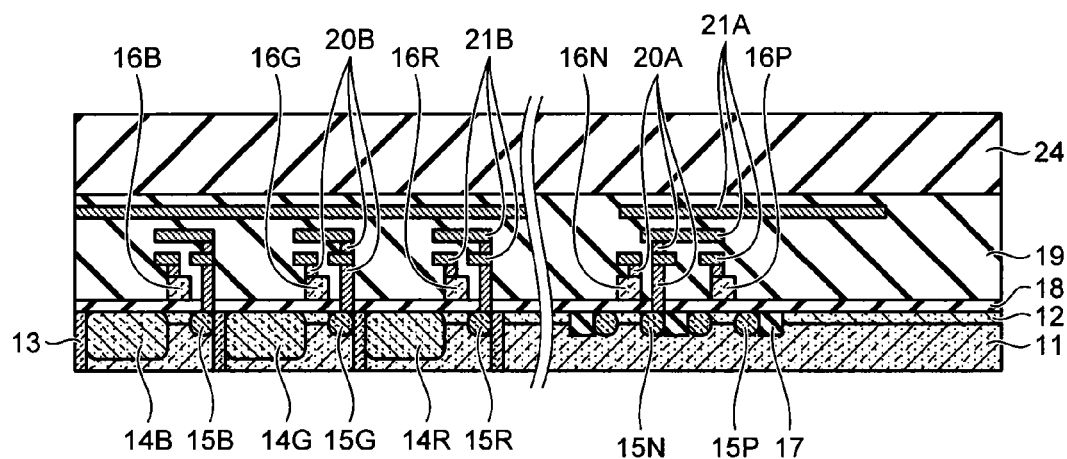
FIGS. 6A and 6B are cross-sectional views illustrating a method of manufacturing a solid state imaging device according to a second embodiment.

Next, as illustrated in FIG. 6A, by removing the Si substrate 31 by CMP or the like and then removing the insulating layer 33 and the SiGe layer 11D, the surface of the SiGe layer 11C is exposed and the crystal defect 32 on the SiGe layer 11C is removed.

Herein, by removing the crystal defect 32 on the SiGe layer 11C, the crystalline quality of the blue photoelectric conversion layer 14B, the green photoelectric conversion layer 14G, and the red photoelectric conversion layer 14R can be improved, so that a high picture quality can be achieved.

Figure 6B:
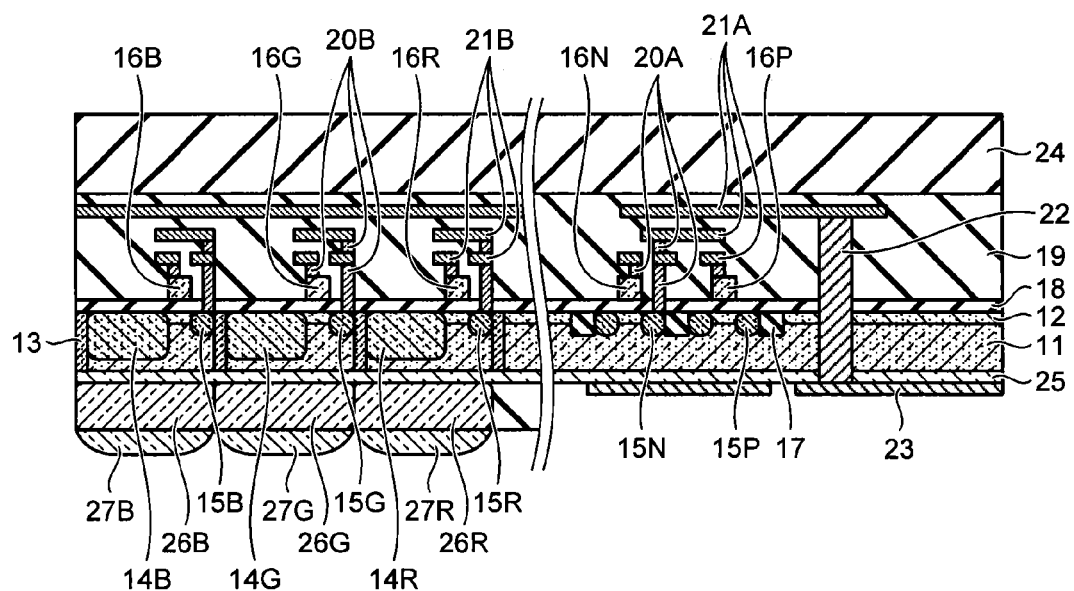

Next, as illustrated in FIG. 6B, an antireflection film 25 is formed on the SiGe layer 11 by CVD, sputtering, or the like. In addition, for example, a material of the antireflection film 25 may use a silicon oxide film or a silicon nitride film. Then, in the peripheral region RA1, through a through hole insulating layer (not illustrated), a plug electrode 22 is buried in the antireflection film 25, the SiGe layer 11, the Si layer 12, and the interlayer insulating layer 19 such that the plug electrode 22 is connected to the interconnection 21A.

Next, in the peripheral region RA1, a pad electrode 23 connected to the plug electrode 22 is formed on the antireflection film 25. Next, in the pixel region RA2, a blue filter 26B, a green filter 26G, and a red filter 26R are formed on the antireflection film 25 in each pixel, and then on-chip lenses 27B, 27G and 27R are formed respectively on the blue filter 26B, the green filter 26G, and the red filter 26R. In addition, for example, a material of the blue filter 26B, the green filter 26G and the red filter 26R and the on-chip lenses 27B, 27G and 27R may use a transparent organic compound.

Third Embodiment

Figures 7A, 7B, 7C:
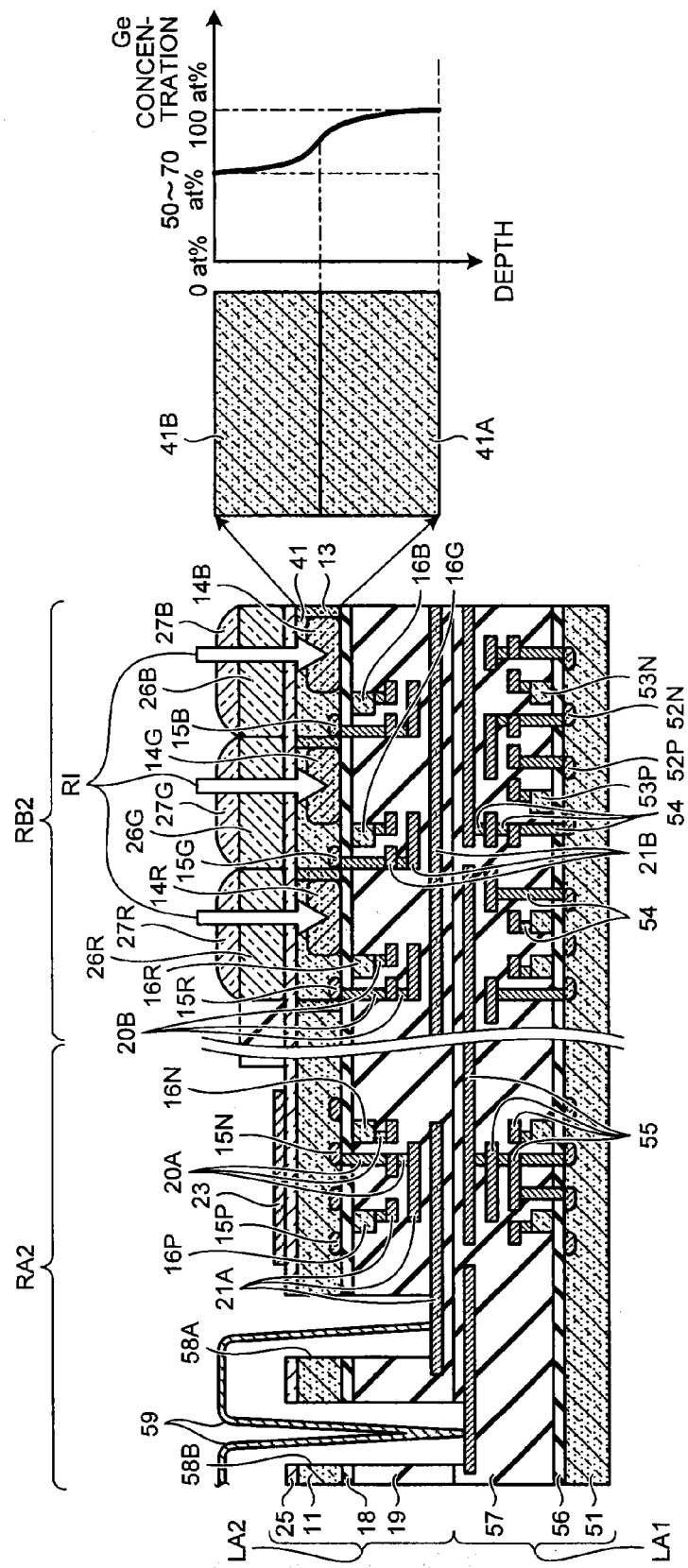
FIG. 7A is a cross-sectional view illustrating a schematic configuration of a solid state imaging device according to a third embodiment.
FIG. 7B is an enlarged cross-sectional view illustrating a portion of a SiGe layer 41 of FIG. 7A.
FIG. 7C is a diagram illustrating a depth-direction concentration profile of the SiGe layer 41 of FIG. 7B.

FIG. 7A is a cross-sectional view illustrating a schematic configuration of a solid state imaging device according to a third embodiment, FIG. 7B is an enlarged cross-sectional view illustrating a portion of a SiGe layer 41 of FIG. 7A, and FIG. 7C is a diagram illustrating a depth-direction concentration profile of the SiGe layer 41 of FIG. 7B.

Referring to FIGS. 7A to 7C, a SiGe layer 41 is provided in the solid state imaging device. In addition, the SiGe layer 41 may be set to be a P type. Also, a surface of the SiGe layer 41 may be a polished surface formed by removing the crystal defects of the SiGe layer 41. Herein, SiGe layers 41A and 41B are provided in the SiGe layer 41. The SiGe layer 41B is formed at an uppermost layer of the SiGe layer 41 from the viewpoint of an incident light RI side. In addition, a minimum value of the Ge concentration of the SiGe layer 41B may be set to be within a range of 50 to 70 at %. The SiGe layer 41A is formed under the SiGe layer 41B and has a higher Ge concentration than the SiGe layer 41B. In addition, a maximum value of the Ge concentration of the SiGe layer 41A may be set to 100 at %. Also, a thickness of the SiGe layer 41 may be set to about 1 μm.

Herein, the SiGe layer 41 is provided in a pixel layer LA2, and a pixel region RB2 and a peripheral region RA2 are provided in the pixel layer LA2. From the viewpoint of the incident light RI side, a circuit layer LA1 is provided under the pixel layer LA2. In addition, the pixel array unit 1 of FIG. 1 may be formed in the pixel region RB2. An amplifier amplifying a signal read from a pixel of the pixel array unit 1 may be formed in the peripheral region RA2. The vertical scanning circuit 2, the load circuit 3, the column ADC circuit 4, the horizontal scanning circuit 4, the reference voltage generating circuit 6, and the timing control circuit 7 of FIG. 1 may be formed in the circuit layer LA1. The circuit layer LA1 may also serve as the support substrate 24 of FIGS. 4A and 4B.

Then, in the pixel region RB2, at the SiGe layer 41, a blue photoelectric conversion layer 14B, a green photoelectric conversion layer 14G, and a red photoelectric conversion layer 14R are formed in each pixel PC. Also, in the SiGe layer 41, a pixel separation layer 13 is formed to separate the blue photoelectric conversion layer 14B, the green photoelectric conversion layer 14G, and the red photoelectric conversion layer 14R in each pixel PC. Also, in the pixel region RB2, at the SiGe layer 41, N-type impurity introduction layers 15B, 15G and 15R are formed to be adjacent respectively to the blue photoelectric conversion layer 14B, the green photoelectric conversion layer 14G, and the red photoelectric conversion layer 14R. Then, gate electrodes 16B, 16G and 16R are formed on the SiGe layer 41 through a gate insulating layer 18 such that the gate electrodes 16B, 16G and 16R are disposed between the blue photoelectric conversion layer 14B, the green photoelectric conversion layer 14G and the red photoelectric conversion layer 14R and the N-type impurity introduction layers 15B, 15G and 15R.

Also, as in the pixel region RB1 of FIGS. 4A and 4B, in the pixel region RB2, an interlayer insulating layer 19, a plug electrode 20B, and an interconnection 21B are formed on the gate electrodes 16B, 16G and 16R. Also, in the pixel region RB2, an antireflection film 25, a blue filter 26B, a green filter 26G, a red filter 26R, and on-chip lenses 27B, 27G and 27R are formed on the SiGe layer 41.

On the other hand, as in the peripheral region RA1 of FIGS. 4A and 4B, in the peripheral region RA2, an N-type impurity introduction layer 15N and a P-type impurity introduction layer 15P are formed in the SiGe layer 41. Also, as in the peripheral region RA1 of FIGS. 4A and 4B, in the peripheral region RA2, gate electrodes 16N and 16P are formed on the SiGe layer 41 through the gate insulating layer 18. In addition, as in the peripheral region RA1 of FIGS. 4A and 4B, in the peripheral region RA2, an interlayer insulating layer 19, a plug electrode 20A, and an interconnection 21A are formed on the gate electrodes 16N and 16P.

On the other hand, a Si substrate 51 is provided in the circuit layer LA1. In addition, the Si substrate 51 may be set to be a P type. Then, an N-type impurity introduction layer 52N and a P-type impurity introduction layer 52P are formed in the Si substrate 51. In addition, around the P-type impurity introduction layer 52P, an N well (not illustrated) may be formed in the Si layer 51. Then, gate electrodes 53N and 53P are formed on the Si layer 51 through the gate insulating layer 56 such that the gate electrodes and are disposed respectively between the N-type impurity introduction layers 52N and the P-type impurity introduction layers 52P. In addition, a material of the gate electrodes 53N and 53P may use, for example, a polycrystalline silicon film. Alternatively, a material of the gate electrodes 53N and 53P may use one or a combination of metal compounds such as a titanium nitride, a tantalum carbon, a lanthanum-based material, an aluminum-based material, and a magnesium-based material.

Also, on the Si layer 51, an interlayer insulating layer 57 is formed to cover the gate electrodes 53N and 53P. Then, a plug electrode 54 and an interconnection 55 are buried in the interlayer insulating layer 57. In addition, the interconnection 55 may be connected through the plug electrode 54 to the N-type impurity introduction layer 52N, the P-type impurity introduction layer 52P, and the gate electrodes 53P and 53N. In addition, a material of the plug electrode 54 and the interconnection 55 may use, for example, metals such as Al, Cu, and W. Then, an interlayer insulating layer 19 is disposed on the interlayer insulating layer 57, so that a pixel layer LA2 is laminated on the circuit layer LA1.

Also, in the peripheral region RA2, an opening portion 58A is formed in the antireflection film 25, the SiGe layer 41, and the interlayer insulating layer 19, and an opening portion 58B is formed in the antireflection film 25, the SiGe layer 41, and the interlayer insulating layers 19 and 57. Then, the interconnections 21A and 55 are connected to each other through a bonding wire 59 and are drawn to the outside.

Herein, by forming the blue photoelectric conversion layer 14B, the green photoelectric conversion layer 14G, and the red photoelectric conversion layer 14R by the SiGe layer 41, even when a thickness is set to about 1 μm, the sensitivity of red light can be maintained. Also, even when a pixel pitch is reduced to 1.4 μm or less, a color mixture between adjacent pixels can be suppressed. Also, by setting the maximum value of the Ge concentration of the SiGe layer 41A to 100 at %, the sensitivity of red light can be improved, and the SiGe layer 41 can be thinned. Also, by setting the minimum value of the Ge concentration of the SiGe layer 41B to be within a range of 50 to 70 at %, the gradient of the Ge concentration of the SiGe layer 41 can be alleviated, and the degradation of the crystalline quality of the SiGe layer 41 can be suppressed. Also, by providing the circuit layer LA1 under the pixel layer LA2, a chip size can be reduced and the support substrate 24 of FIGS. 4A and 4B may not be needed.

Also, by forming the circuit layer LA1 in the Si substrate 51, the Si layer for forming the circuit layer LA1 need not be formed on the SiGe layer 41. Therefore, the SiGe layer 41 need not have a Ge concentration gradient changing from 100 at % to 0at % in the depth-direction. Also, even when the thickness of the SiGe layer 41 is reduced, the degradation of the crystalline quality of the SiGe layer 41 can be suppressed.

Fourth Embodiment

Figures 8A, 8B, 8C:
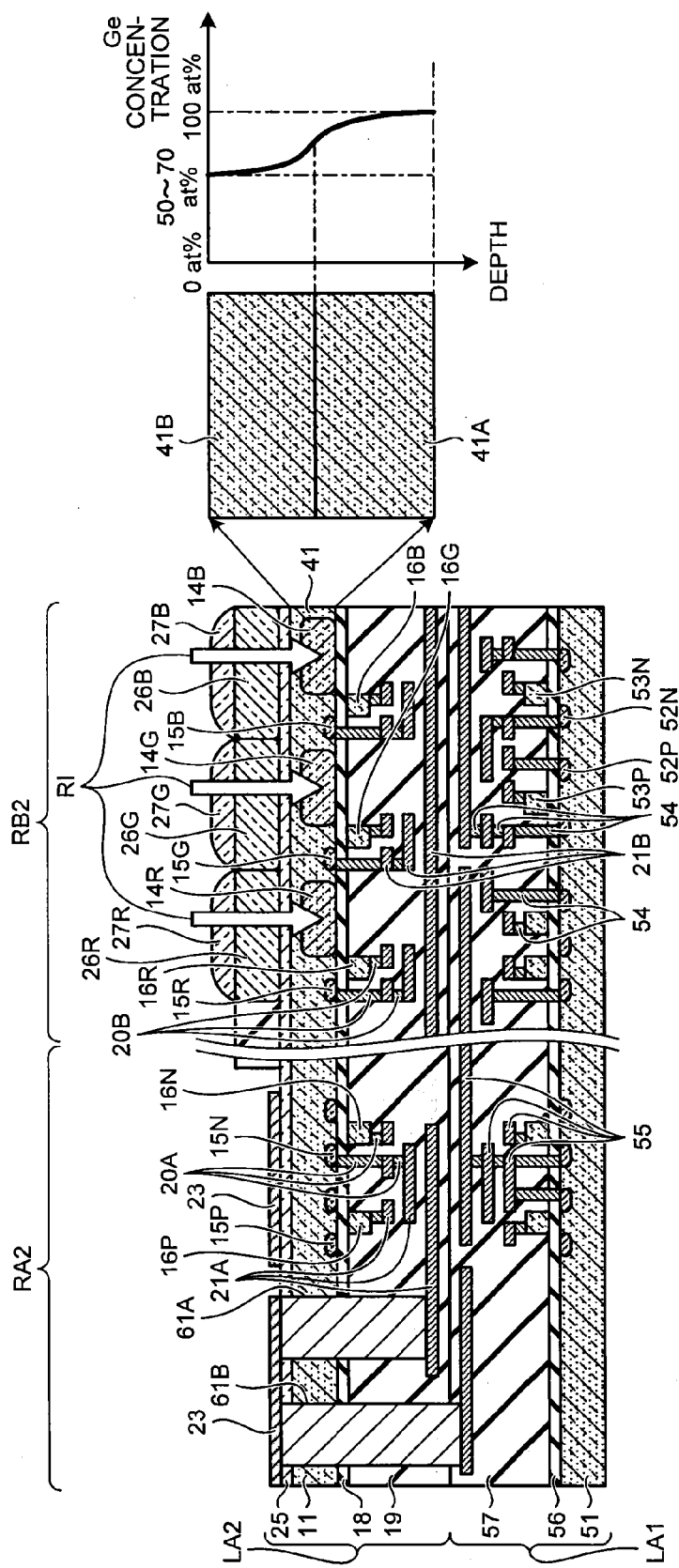
FIG. 8 is a cross-sectional view illustrating a schematic configuration of a solid state imaging device according to a fourth embodiment.

FIGS. 8A to 8C is a cross-sectional view illustrating a schematic configuration of a solid state imaging device according to a fourth embodiment.

Referring to FIGS. 8A to 8C, while the interconnections 21A and 55 of FIGS. 7A to 7C are connected to each other through the bonding wire 59, interconnections 21A and 55 in the configuration of FIGS. 8A to 8C are connected to a pad electrode 23 through plug electrodes 61A and 61B. The other configurations are the same as those of FIGS. 7A to 7C.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging device comprising:
   a first SiGe layer provided at an uppermost layer of a photoelectric conversion layer from the viewpoint of an incident light side;
   a second SiGe layer provided under the first SiGe layer in the photoelectric conversion layer and having a higher Ge concentration than the first SiGe layer;
   a third SiGe layer provided under the second SiGe layer in the photoelectric conversion layer and having a lower Ge concentration than the second SiGe layer; and
   a Si layer provided under the third SiGe layer in the photoelectric conversion layer.

2. The solid state imaging device according to claim 1, comprising a transistor formed on the Si layer.

3. The solid state imaging device according to claim 1, wherein a minimum value of a Ge concentration of the first SiGe layer is set to be within a range of 50 to 70 at %.

4. The solid state imaging device according to claim 1, wherein a maximum value of a Ge concentration of the second SiGe layer is set to 100 at %.

5. The solid state imaging device according to claim 1, comprising:
   an antireflection film formed on the first SiGe layer;
   a color filter formed on the antireflection film; and
   an on-chip lens formed on the color filter.

6. The solid state imaging device according to claim 1, wherein pixels provided with the photoelectric conversion layer are arranged in the first SiGe layer in a matrix configuration in a row direction and a column direction.

7. The solid state imaging device according to claim 6, wherein the Si layer includes:
   a vertical scanning circuit scanning a pixel as a read target in a vertical direction;
   a horizontal scanning circuit scanning a pixel as a read target in a horizontal direction;
   a load circuit reading a signal from each pixel in each column by performing a source follower operation between pixels;
   a column ADC circuit detecting a signal component of each pixel in each column by a CDS; and
   a timing control circuit controlling a timing of reading or storing each pixel.

8. A method of manufacturing a solid state imaging device, comprising:
   forming an insulating layer on a Si substrate;
   forming an opening portion in the insulating layer;
   forming a first SiGe layer covering the insulating layer on the Si substrate;
   forming a second SiGe layer having a higher Ge concentration than the first SiGe layer on the first SiGe layer;
   forming a third SiGe layer having a lower Ge concentration than the second SiGe layer on the second SiGe layer;
   forming a Si layer on the third SiGe layer;
   forming a photoelectric conversion layer in the first SiGe layer, the second SiGe layer, the third SiGe layer, and the Si layer;
   forming a transistor on the Si layer; and
   removing the Si substrate and the insulating layer.

9. The method according to claim 8, wherein crystal defects generated in the first SiGe layer are confined in the opening portion.

10. The method according to claim 9, wherein the crystal defects generated in the first SiGe layer are removed when the Si substrate and the insulating layer are removed.

11. The method according to claim 8, wherein a minimum value of a Ge concentration of the first SiGe layer is set to be within a range of 50 to 70 at %.

12. The method according to claim 8, wherein a maximum value of a Ge concentration of the second SiGe layer is set to 100 at %.

13. A solid state imaging device comprising:
   a SiGe layer provided on a surface side of a photoelectric conversion layer from the viewpoint of an incident light side; and
   a Si layer provided under the SiGe layer in the photoelectric conversion layer,
   the SiGe layer including
   an upper portion provided at an uppermost layer of the SiGe layer, the upper portion including Si and Ge;
   a middle portion provided under the upper portion in the SiGe layer, the middle portion including at least Ge and having a higher Ge concentration than the upper portion; and
   a lower portion provided under the middle portion in the SiGe layer, the lower portion including Si and Ge and having a lower Ge concentration than the middle portion.

14. The solid state imaging device according to claim 13, comprising a transistor formed on the Si layer.

15. The solid state imaging device according to claim 13, wherein a minimum value of a Ge concentration of the upper portion is set to be within a range of 50 to 70 at %.

16. The solid state imaging device according to claim 13, wherein a maximum value of a Ge concentration of the middle portion is set to 100 at %.

17. The solid state imaging device according to claim 13, comprising:
   an antireflection film formed on the upper portion of the SiGe layer;
   a color filter formed on the antireflection film; and
   an on-chip lens formed on the color filter.

18. The solid state imaging device according to claim 13, wherein pixels provided with the photoelectric conversion layer are arranged in the SiGe layer in a matrix configuration in a row direction and a column direction.

19. The solid state imaging device according to claim 18, wherein the Si layer includes:
   a vertical scanning circuit scanning a pixel as a read target in a vertical direction;
   a horizontal scanning circuit scanning a pixel as a read target in a horizontal direction;
   a load circuit reading a signal from each pixel in each column by performing a source follower operation between pixels;
   a column ADC circuit detecting a signal component of each pixel in each column by a CDS; and
   a timing control circuit controlling a timing of reading or storing each pixel.

* * * * *